United States Patent [19]

Mori

[11] Patent Number: 5,705,431
[45] Date of Patent: Jan. 6, 1998

[54] PRODUCTION METHOD FOR INSULATED SEMICONDUCTOR DEVICE

[75] Inventor: Motohisa Mori, Tokyo, Japan

[73] Assignee: NEC Corporation, Tokyo, Japan

[21] Appl. No.: 808,036

[22] Filed: Mar. 4, 1997

[30] Foreign Application Priority Data

Mar. 8, 1996 [JP] Japan ................ 8-080777

[51] Int. Cl.$^6$ ........................................ H01L 21/60
[52] U.S. Cl. .................. 437/217; 437/209; 437/219; 437/220
[58] Field of Search ................... 437/209, 211, 437/214, 217, 219, 220

[56] References Cited

U.S. PATENT DOCUMENTS

| | | | |
|---|---|---|---|
| 5,172,214 | 12/1992 | Casto | 437/220 |
| 5,202,288 | 4/1993 | Doering et al. | 437/209 |
| 5,327,008 | 7/1994 | Djennas et al. | 437/220 |
| 5,409,866 | 4/1995 | Sato et al. | 437/211 |
| 5,529,959 | 6/1996 | Yamanaka | 437/217 |

*Primary Examiner*—Kevin Picardat
*Attorney, Agent, or Firm*—Young & Thompson

[57] ABSTRACT

The invention provides a production method for an insulated semiconductor device which eliminates displacement between positions of upper and lower metallic mold cavities (between upper and lower caps) when a resin is filled to achieve improvement in quality and productivity. A lead shaping apparatus for shaping inner lead portions of a flat hoop frame supplied thereto from a frame supply apparatus is located between the frame supply apparatus and a die bonding apparatus so that, before die bonding of semiconductor pellets is performed, shaping of the inner lead portions is performed. Thereafter, die bonding and wire bonding are performed for the flat hoop frame, and then, resin is filled only into a lower metallic mold cavity by a resin filling apparatus to embed the inner lead portions in the resin.

6 Claims, 16 Drawing Sheets

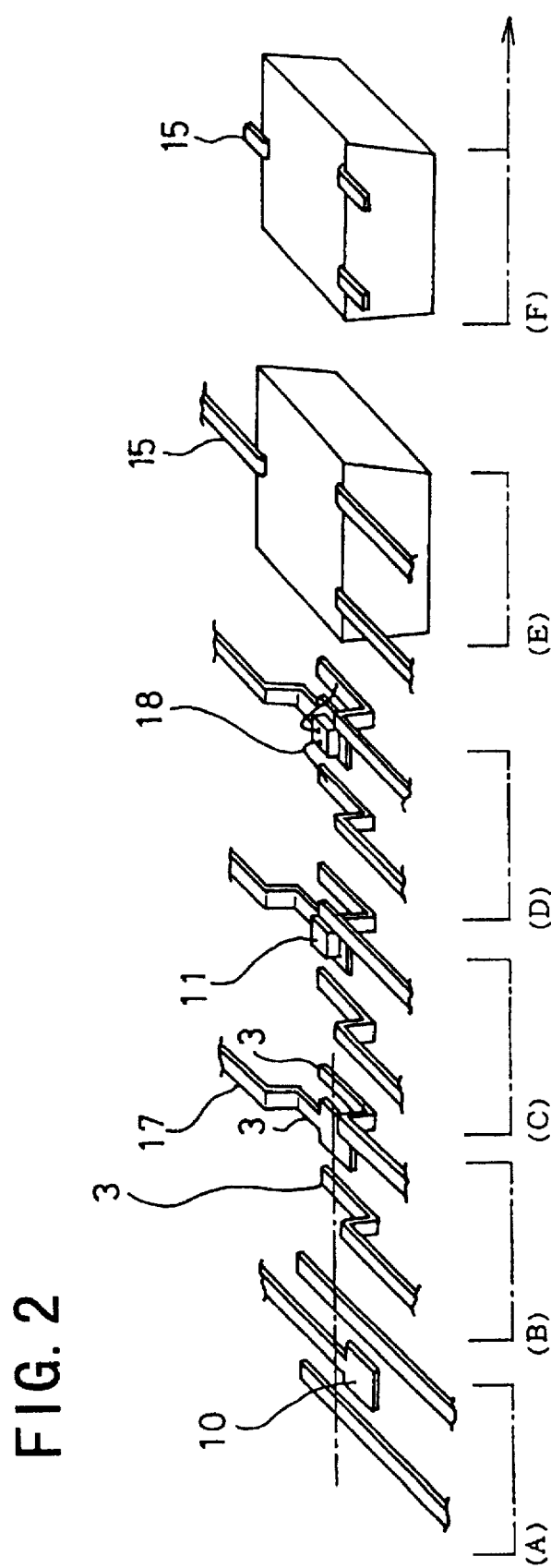

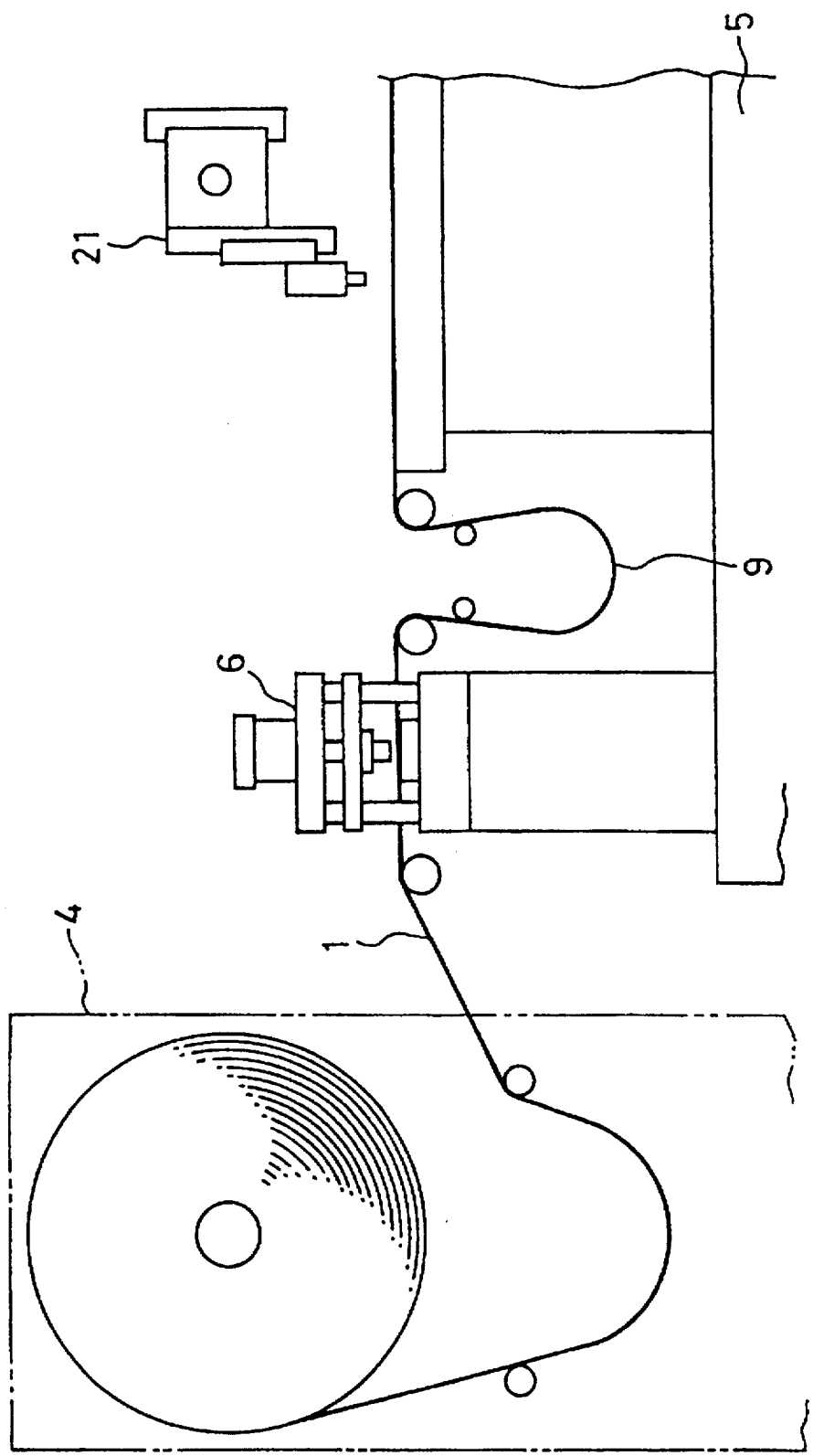

PRIOR ART

PRODUCTION METHOD FOR INSULATED SEMICONDUCTOR DEVICE

BACKGROUND OF THE INVENTION

1. Field of the Invention

This invention relates to a production method for an insulated semiconductor device.

2. Description of the Related Art

An exemplary one of conventional production methods for an insulated semiconductor device is first described with reference to FIG. 12 which illustrates a manner in which it is produced in six different steps A to F. A flat hoop frame having sets of lead portions having inner lead portions 3 is successively supplied from a frame supply apparatus to a die bonding apparatus (step A), and die bonding of a semiconductor pellet 11 on an island 10 of one of the inner lead portions 3 of each set of lead portions is performed (step B). Then, the flat hoop frame is supplied to a wire bonding apparatus via a buffer.

The wire bonding apparatus performs wire bonding for a pad (not shown) of the semiconductor pellet 11 and the other inner lead portion 3 of the set of lead portions using wires 18 (step C). Then, the flat hoop frame is supplied to a resin filling apparatus via another buffer.

The resin filling apparatus holds and pressurizes the flat hoop frame between an upper metallic mold 14 and a lower metallic mold 15 as seen in FIG. 13, fills a resin into an upper metallic mold cavity 24 and a lower metallic mold cavity 16 above and below the flat hoop frame to embed the inner lead portions 3 of each set of lead portions in the resin (step D of FIG. 12), and then accommodates the flat hoop frame with the inner lead portions 3 embedded in the resin into a frame take-up apparatus. The flat hoop frame taken up by the frame take-up apparatus is then solder plated by a solder plating machine, whereafter it is supplied to and worked by, in the following steps E and F illustrated in FIG. 12, a composite apparatus (including a lead cutting apparatus, a lead shaping apparatus, a selection apparatus, a printing apparatus and a taping apparatus), by which it is taken up by a predetermined amount onto a shipment reel.

According to the conventional production method for a semiconductor device, such a semiconductor device 20 as shown in FIG. 14 is produced by the steps that, for a flat hoop frame supplied from a frame supply apparatus, a semiconductor pellet is die bonded to an island of a flat inner lead portion by a die bonding apparatus and then a pad of the semiconductor pellet and the other inner lead portions are wire bonded by a wire bonding apparatus, whereafter a resin is filled into upper and lower metallic mold cavities (24 and 16 in FIG. 13) by a resin filling apparatus and then solder plating is performed by a solder plating apparatus, and then the flat hoop frame is supplied to a composite apparatus. Consequently, if the positions of the upper and lower metallic mold cavities (upper and lower caps) are displaced from each other when a resin is to be filled, then when the flat hoop frame is worked by the composite apparatus, since such working by the composite apparatus is performed with the flat hoop frame positioned with reference to the outer profile of the semiconductor device, outer leads 17 are cut such that they have different lengths on the left side and the right side of the semiconductor device. Consequently, upon shaping of the outer leads 17 (refer to FIG. 14), they are not shaped in specified dimensions in terms of the vertical or height position, the lead width and the length of a flat face.

The conventional method is disadvantageous also in that waste solder produced upon soldering sticks to and disturbs accurate positioning by a positioning stage or a positioning clamper.

The conventional method is further disadvantageous in that, in the selection step, accurate measurement is disturbed by a dispersion in length of a flat face or inaccurate positioning.

Further, while a flat hoop frame is produced by stamping, if inner lead portions are shaped upon the stamping, then when the flat hoop frame is taken up onto a supply reel, the leads are liable to be deformed.

The conventional method is disadvantageous also in that, when the winding diameter on a reel increases, the operability is deteriorated, and the operation cannot be performed.

SUMMARY OF THE INVENTION

It is an object of the present invention to provide a production method for an insulated semiconductor device which eliminates displacement between positions of upper and lower metallic mold cavities (between upper and lower caps) when a resin is filled to achieve improvement in quality and productivity.

In order to attain the object described above, according to the present invention, before die bonding, leads of a flat hoop frame are shaped so that outer lead portions may be positioned at predetermined positions with respect to an outer profile of a semiconductor device after a resin is filled.

More particularly, according to the present invention, there is provided a production method for an insulated semiconductor device, comprising the steps of forming a flat hoop frame having a plurality of rows of sets of leads such that inner lead portions of the leads extend farther than corresponding resin filling centers so that outer lead portions of the leads may be positioned at predetermined positions with respect to outer profiles of semiconductor devices after resin is filled and supplying the flat hoop frame from a frame supply apparatus, shaping the inner lead portions of the leads of the flat hoop frame simultaneously for the plurality of rows and for a plurality of pitches by a lead shaping apparatus, performing die bonding of semiconductor pellets and wire bonding for the flat hoop frame, and filling, for each set of leads, resin into one of two cavities by a resin filling apparatus so that the outer lead portions of the leads of the flat hoop frame may be positioned at the predetermined positions with respect to the outer profiles of the semiconductor devices after the resin is filled. Thus, since only one of upper and lower metallic mold cavities is required for resin filling, otherwise possible displacement between the positions of upper and lower metallic mold cavities (displacement between upper and lower caps) can be prevented.

Further, the production method for an insulated semiconductor device eliminates lead shaping processing by a composite apparatus. Consequently, various problems which otherwise originate from lead shaping by a composite apparatus including failure in shaping of outer lead portions with accurate dimensions, production of a gap between an outer lead portion and a portion of a resin block at which the outer lead portion is attached upon lead shaping, production of waster solder, inaccurate measurement of an outer lead foot portion by elongation upon selection and so forth are eliminated, and augmentation in quality, productivity and maintenance feasibility can be achieved.

Furthermore, since only one metallic mold cavity is required for the resin filling apparatus and a lead shaping apparatus of a composite apparatus is eliminated, reduction in cost for the metallic mold and the composite apparatus can be achieved.

Preferably, the inner lead portions of the leads of the flat hoop frame extend by a predetermined additional length farther than the positions of the individual resin filling centers.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 2 is a schematic views illustrating different steps of a production method for an insulated semiconductor device according to a preferred embodiment of the present invention;

FIG. 6 is a schematic view illustrating detailed steps performed by a frame supply apparatus, a lead shaping apparatus and a die bonding apparatus in the production method illustrated in FIG. 2;

DESCRIPTION OF THE PREFERRED EMBODIMENTS

Figure 1:
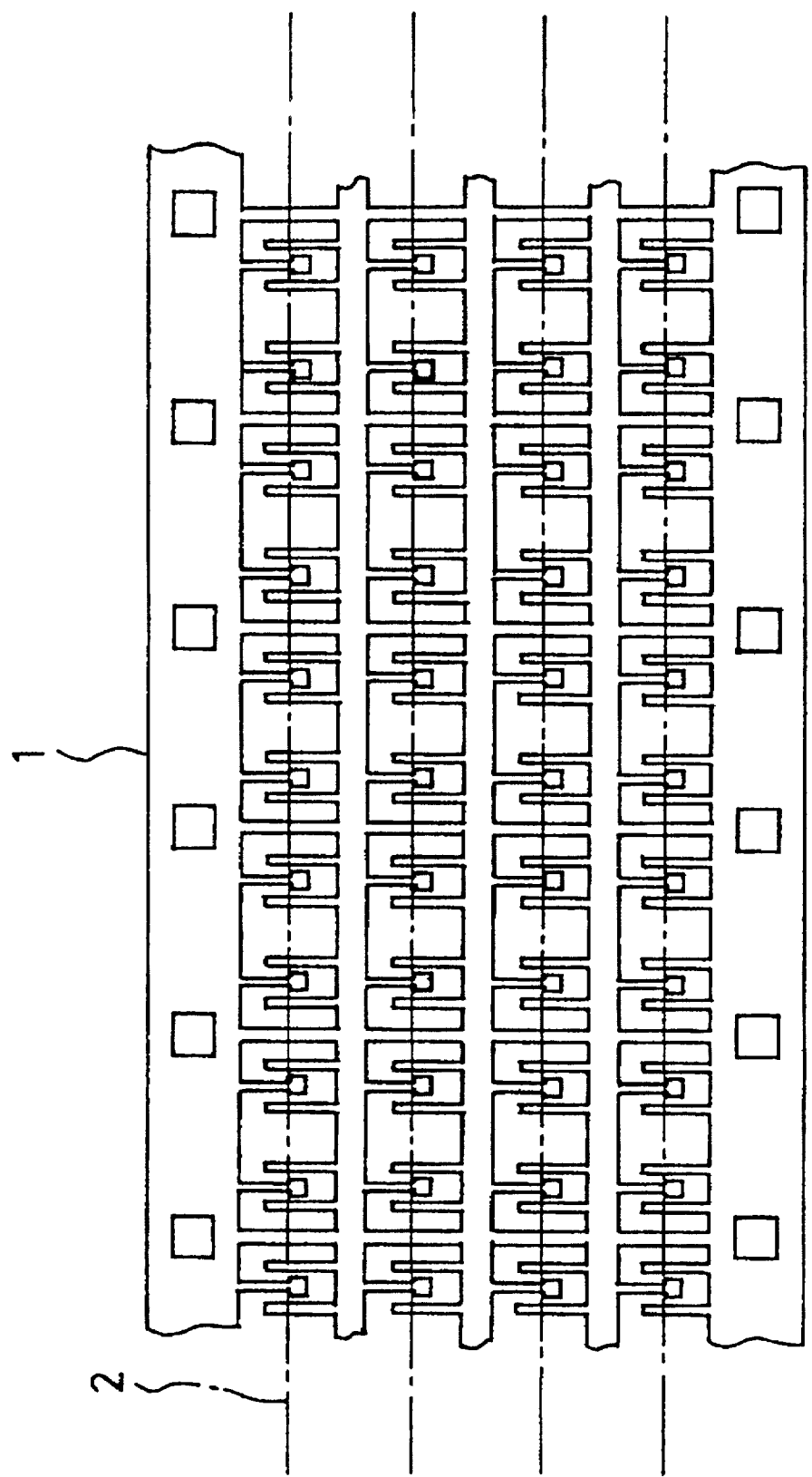
FIG. 1 is a plan view of a flat hoop frame to which a production method for an insulated semiconductor device according to the present invention is applied.

FIG. 2 illustrates different steps of a production process for an insulated semiconductor device to which the present invention is applied, and FIG. 1 shows a flat hoop frame used for the production method illustrated in FIG. 2.

Referring first to FIG. 1, the flat hoop frame is generally denoted at 1 and includes a large number of sets of leads having inner and outer lead portions arranged in a plurality of (four in FIG. 1) rows. The flat hoop frame 1 is formed such that, in each set of leads, inner lead portions extend farther than the position of a corresponding one of resin filling centers 2 for the individual rows with a lead shaping amount determined taking a semiconductor pellet thickness and a bonding wire height into consideration so that the outer lead portions may be positioned at predetermined positions with respect to the semiconductor device of the set.

The flat hoop frame 1 supplied from a frame supply apparatus (refer to step A of FIG. 2) is successively subject, prior to the step of die bonding a semiconductor pellet to it, to simultaneous shaping of the inner lead portions 3 thereof for the plurality of rows (in the lateral direction) at a plurality of pitches (in the longitudinal direction) by a lead shaping apparatus mounted on the frame supply apparatus or on a die bonding apparatus (refer to step B of FIG. 2). It is to be noted that, where the lead shaping step is performed prior to the die bonding step, the lead shaping apparatus may naturally be provided as a single machine.

Then, after die bonding of a semiconductor pellet to each island 10 (refer to step C of FIG. 2) and wire bonding (refer to step D of FIG. 2) are performed, resin is filled into only one of upper and lower metallic mold cavities by a resin filling apparatus so that the outer lead portions of the flat hoop frame may be positioned at predetermined positions with respect to the outer profiles of the semiconductor devices after the resin is filled (refer to step E of FIG. 2). Then, after the resin is filled, the outer leads 17 are cut by a lead cutting apparatus (refer to step F of FIG. 2).

In the following, the production method for an insulated semiconductor device according to the embodiment of the present invention will be described in more detail.

Figure 4A:
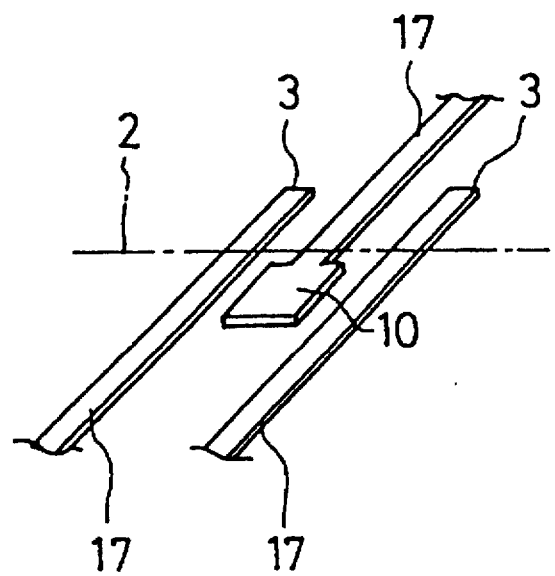
FIG. 4(A) is a detailed perspective view of frame lead portions of the flat hoop frame of FIG. 1 before they are shaped.

As seen in FIG. 1, the flat hoop frame 1 is formed such that the inner lead portions 3 in each set of leads extend farther than the position of the corresponding resin filling center 2 taking a lead shaping amount into consideration. In particular, as seen from FIG. 4(A) which shows details of lead portions of the flat hoop frame 1, the inner lead portions 3 in each set of leads and the island 10 extend farther than the resin filling center 2 by an amount corresponding to the lead shaping amount which is determined taking a semiconductor pellet thickness and a bonding wire height upon lead formation into consideration.

FIG. 6 illustrates details of the steps performed by the frame supply apparatus, lead shaping apparatus and die bonding apparatus. Referring to FIG. 6, the flat hoop frame 1 is fed from the frame supply apparatus 4 to the lead shaping apparatus 6 mounted at a location of the die bonding apparatus 5.

Figure 4B:
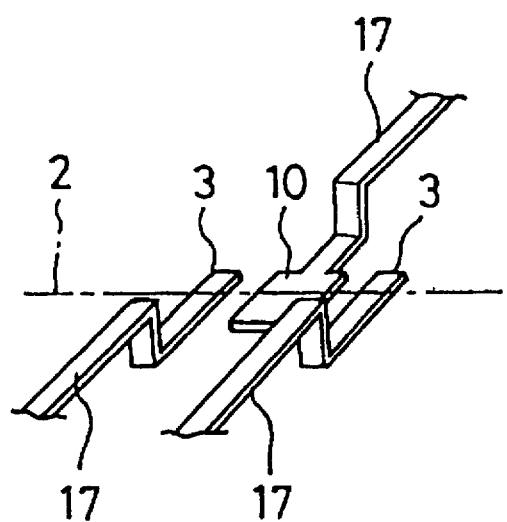
FIG. 4(B) is a detailed perspective view of the frame lead portions of FIG. 4(A) after they are shaped in the production method illustrated in FIG. 2.
Figure 7A:
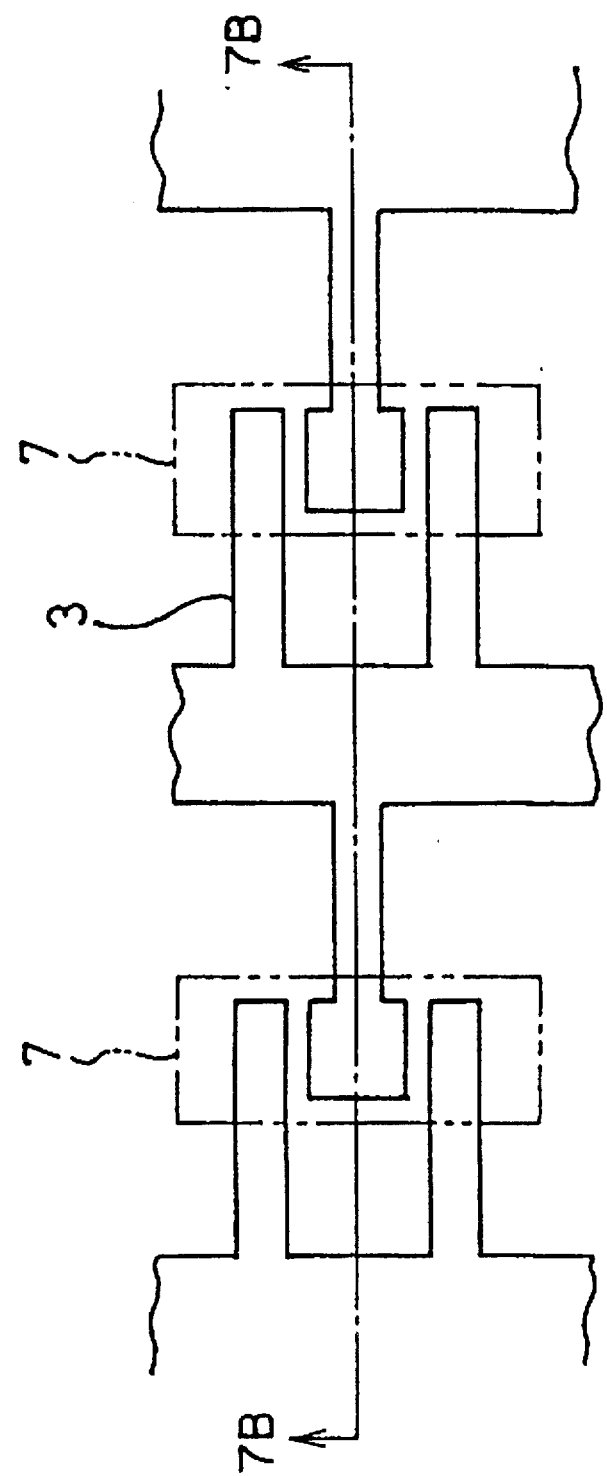
FIG. 7(A) is a detailed plan view of an inner lead shaping section of the lead shaping apparatus shown in FIG. 6.
Figure 7:
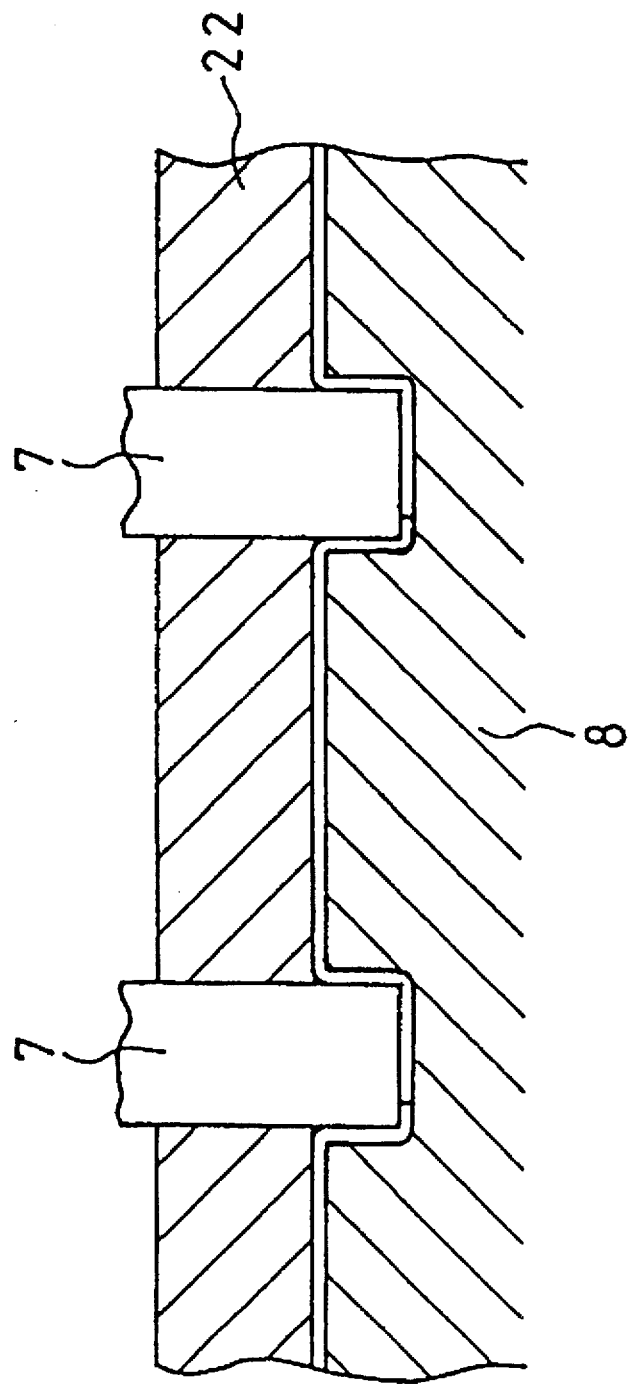
FIG. 7(B) is a sectional view taken along line 7B—7B of FIG. 7(A)

By the lead shaping apparatus 6 to which the flat hoop frame 1 is supplied, the inner lead portions 3 of the flat hoop frame 1 are shaped downwardly into an L-shape simultaneously for the plurality of rows and the plurality of pitches by lead shaping punches 7 and a die 8 as seen in FIGS. 7(A) and 7(B) which illustrate a manner of lead shaping. Thereafter, the flat hoop frame 1 is supplied via a buffer 9 to the die bonding apparatus 5. It is to be noted that FIG. 4(B) illustrates a manner in which the inner lead portions 3 are shaped downwardly into an L-shape by the lead shaping apparatus 6.

By the die bonding apparatus 5, die bonding of semiconductor pellets 11 on the islands 10 of the inner lead portions 3 of the flat hoop frame 1 supplied thereto is performed (refer to step C of FIG. 2). After completion of the die bonding, the flat hoop frame 1 is supplied to a wire bonding apparatus via another buffer.

Figure 8A:
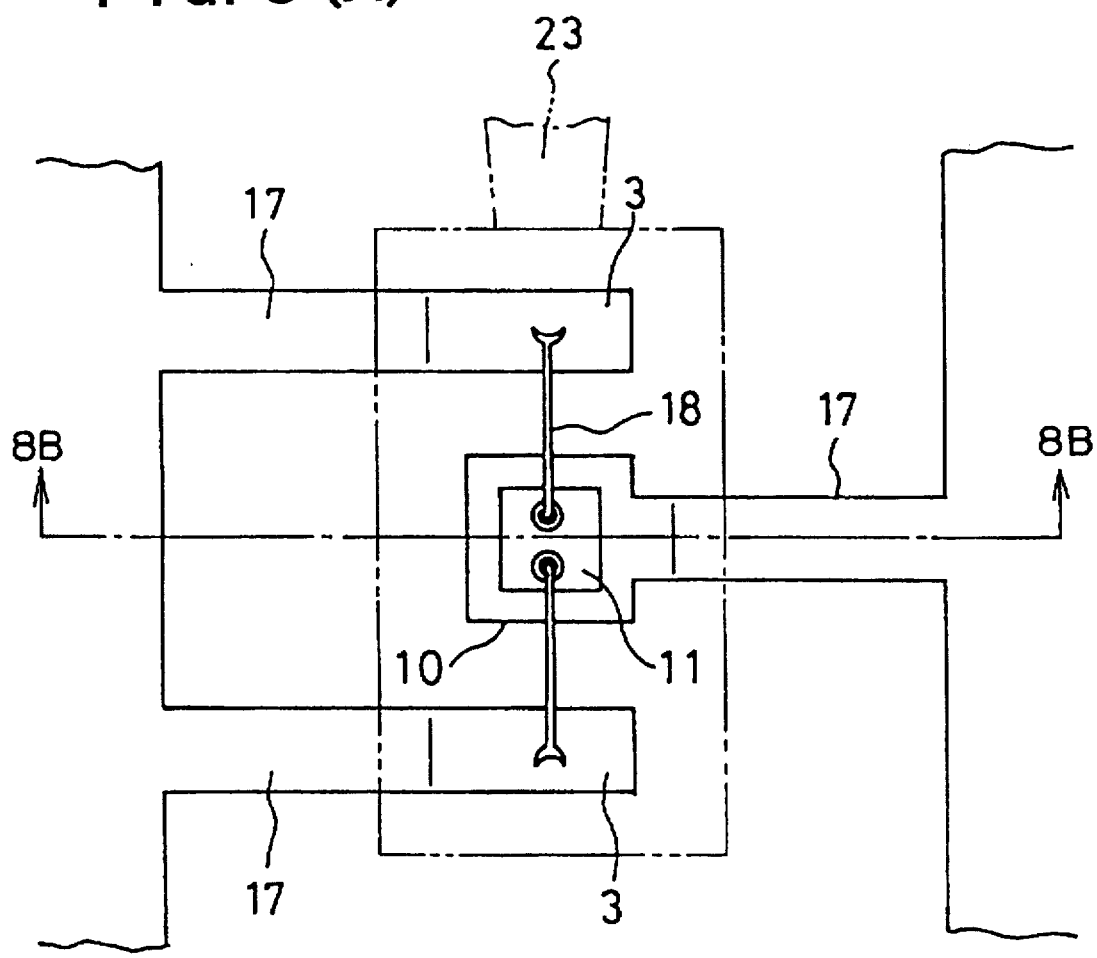
FIG. 8(A) is a detailed plan view of a portion of a resin filling metallic mold employed in the production method illustrated in FIG. 2.

For the flat hoop frame 1 supplied to the wire bonding apparatus, pads of the semiconductor pellets 11 and the inner lead portions 3 are bonded using wires 18 by the wire bonding apparatus (refer to step E of FIG. 2 and also to FIG. 8(A)). After completion of the wire bonding, the flat hoop frame 1 is supplied to a resin filling apparatus via a further buffer.

Figure 3A:
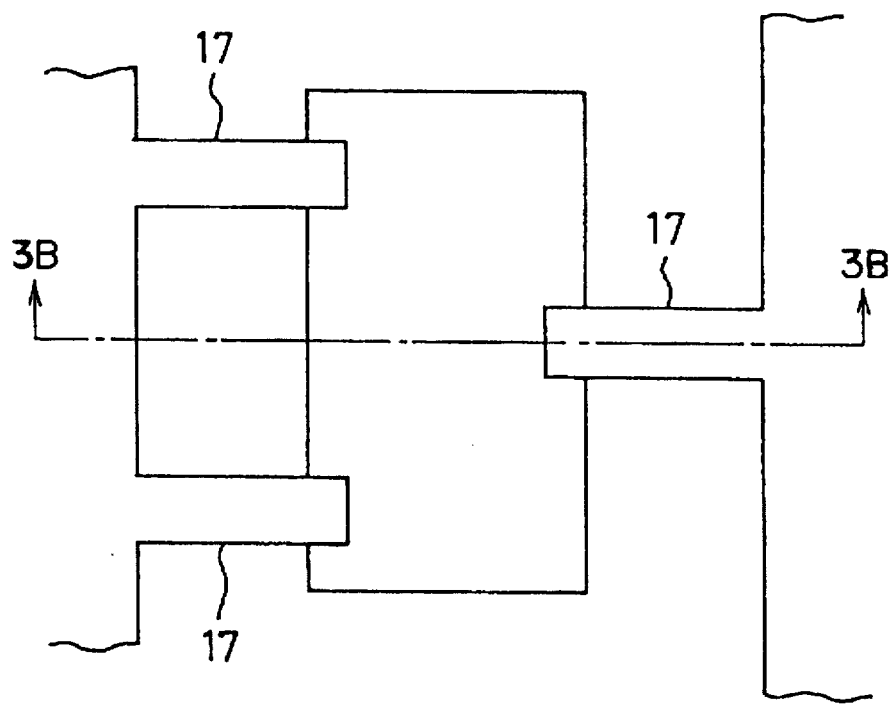
FIG. 3(A) is a detailed plan view of a semiconductor device after a resin is filled in the production method illustrated in FIG. 2.
Figure 3B:
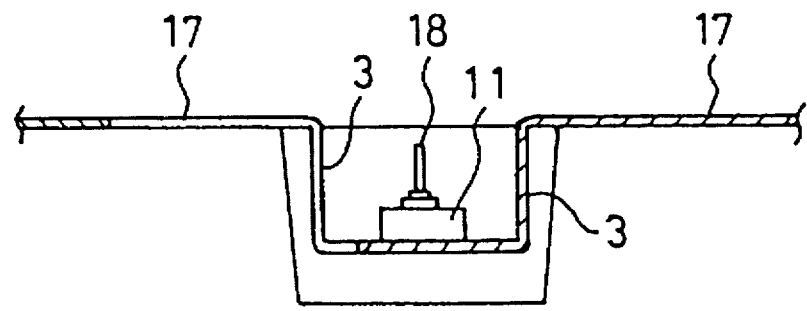
FIG. 3(B) is a sectional view taken along line 3B—3B of FIG. 3(A)
Figure 8B:
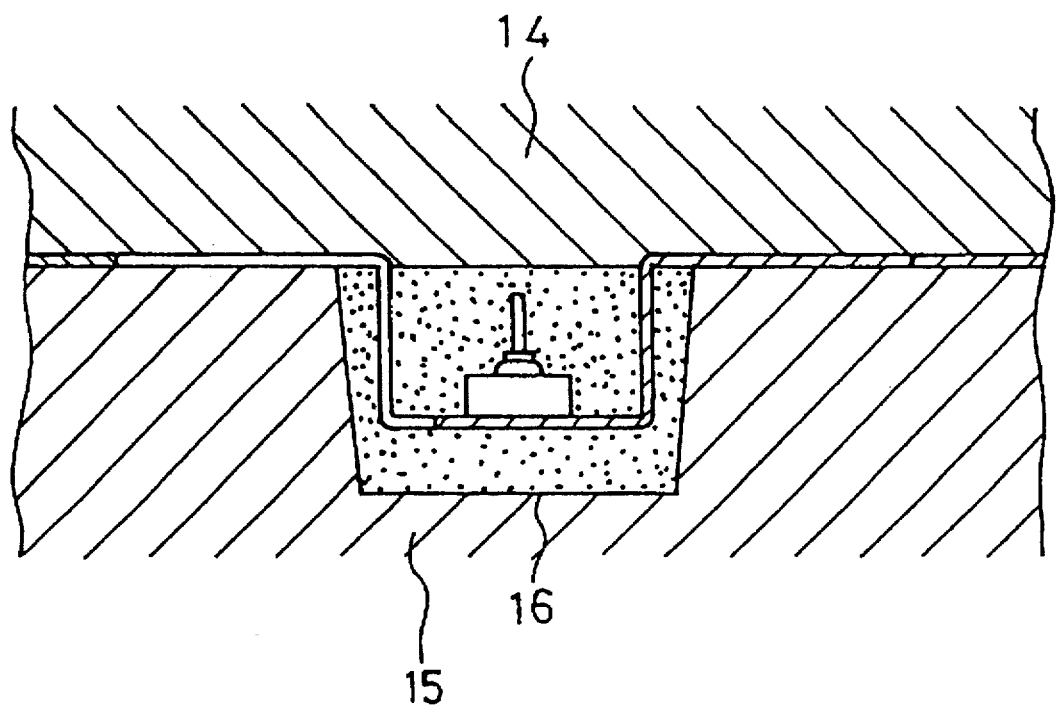
FIG. 8(B) is a sectional view taken along line 8B—8B of FIG. 8(A)

The flat hoop frame 1 supplied to the resin filling apparatus is held between and pressurized by an upper metallic mold 14 and a lower metallic mold 15 as seen in FIG. 8(B), and then resin is filled only into lower metallic mold cavities 16. Thereafter, the flat hoop frame 1 is accommodated into a frame take-up machine. A manner of a semiconductor device and outer leads of it after the resin is filled is shown in plan view in FIG. 3(A) and in sectional view taken along line A—A' of FIG. 3(A) in FIG. 3(B). As seen from FIGS. 3(A) and 3(B), the outer leads 17 of the semiconductor device filled with the resin are bent at an end face of the semiconductor device and then extend in the outward directions (leftward and rightward directions in FIGS. 3(A) and 3(B)) along the end face.

Figure 5:
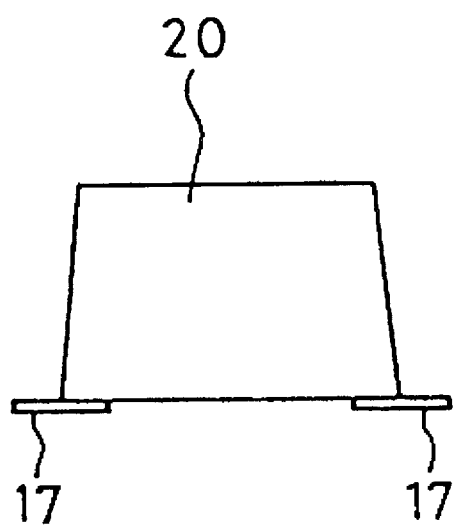
FIG. 5 is a side elevational view of an insulated semiconductor device produced by the production method illustrated in FIG. 2.

After taken up onto the frame take-up machine, the flat hoop frame 1 is solder plated by a solder plating apparatus. After the solder plating, the flat hoop frame 1 is supplied to and worked by a composite apparatus (refer to step F of FIG. 2) which includes a lead cutting apparatus, a selection apparatus, a printing apparatus and a taping apparatus, by which it is finally taken up by a predetermined amount onto a shipment reel. It is to be noted that the outer leads 17 are cut by the composite apparatus so that the outer leads 17 (foot portions) extends along the lower face of the semiconductor device 20 and project by a predetermined amount outwardly from the lower face as seen in FIG. 5.

Figure 9A:
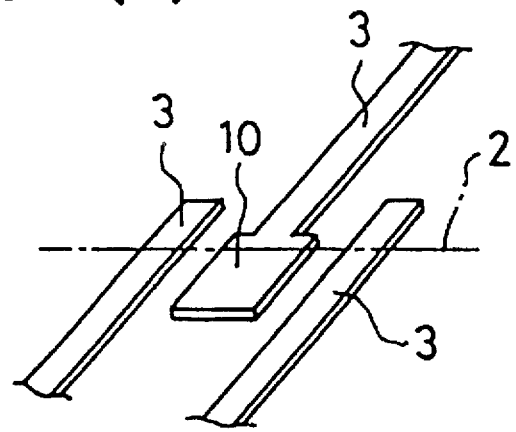
FIG. 9(A) is a detailed perspective view of lead portions of a flat hoop frame employed for a production method for an insulated semiconductor device according to another embodiment of the present invention.
Figure 9B:
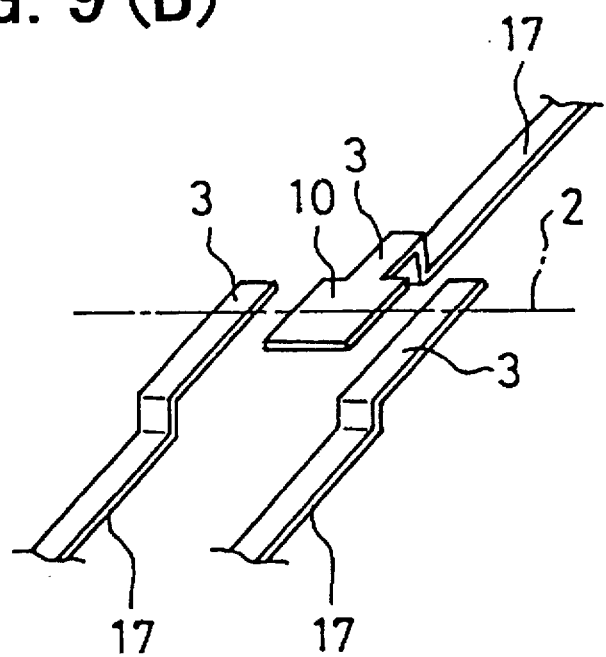
FIG. 9(B) is a detailed perspective view of the lead portions after inner lead shaping is performed by the production method for an insulated semiconductor device of the second embodiment.
Figure 9C:
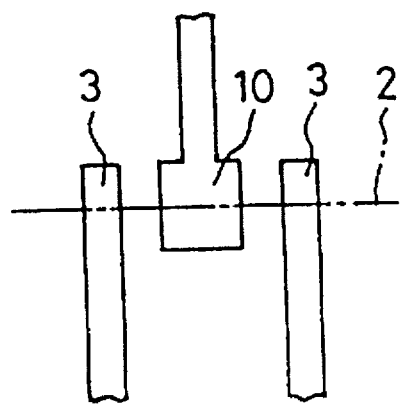
FIG. 9(C) is a detailed plan view of lead portions of a conventional flat hop frame.
Figure 9D:
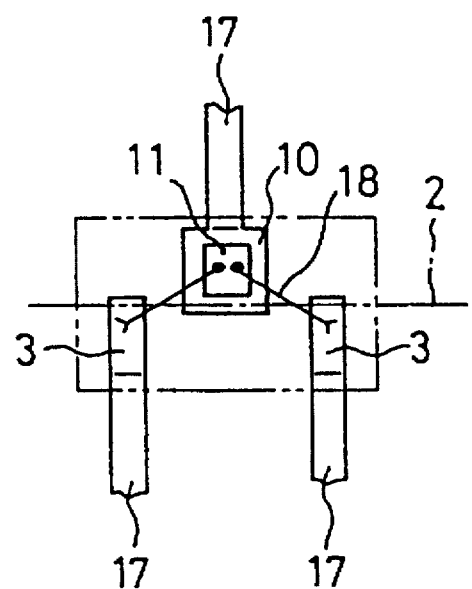
FIG. 9(D) is a detailed plan view of the lead portions of the flat hop frame of FIG. 9(C) after inner lead shaping is performed using a conventional method.

FIG. 9(A) shows details of lead portions of a flat hoop frame which is employed for a production method for an insulated semiconductor device according to another embodiment of the present invention, and FIG. 9(B) shows details of the lead portions after inner lead shaping is performed using the production method for an insulated semiconductor device of the second embodiment. Meanwhile, FIG. 9(C) shows details of lead portions of a conventional flat hop frame, and FIG. 9(D) shows details of the lead portions of the flat hop frame of FIG. 9(C) after inner lead shaping is performed using a conventional method. Further, FIGS. 10(A) and 10(B) show details of a resin filling metallic mold employed in the production method of the present embodiment.

Referring to FIG. 9(A), in the flat hoop frame 1 which is used for the production method of the present embodiment, inner lead portions 3 are formed, taking a lead shaping amount into consideration, such that they are elongated farther than the position of a corresponding resin filling center 2.

For the flat hoop frame 1, the inner lead portions 3 are shaped upwardly into an L-shape simultaneously for a plurality of rows and a plurality of pitches by a lead shaping apparatus (refer to FIG. 9(B)).

Figure 10:
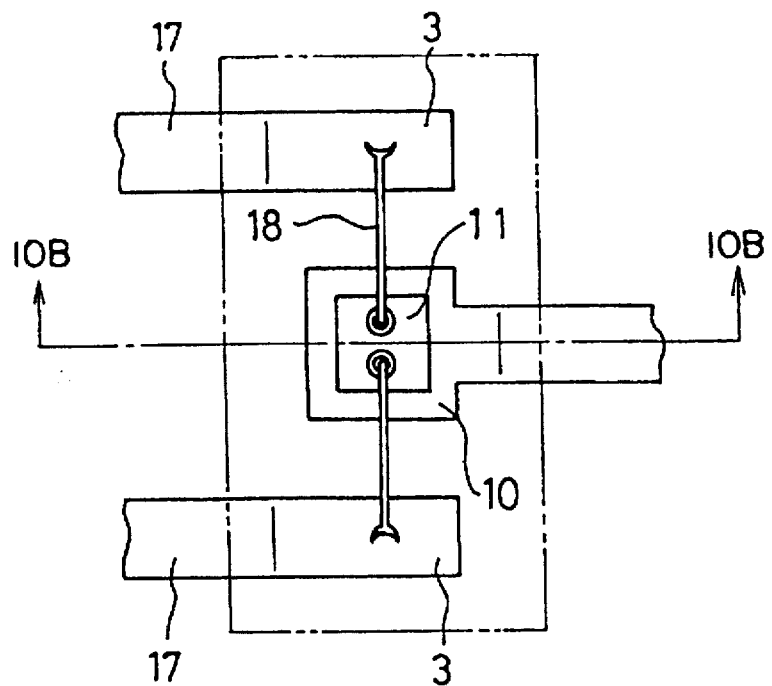
FIG. 10(A) is a detailed plan view of a portion of a resin filling metallic mold employed in the production method of the second embodiment.
FIG. 10(B) is a sectional view taken along line 10B—10B of FIG. 10(A)
Figure 10:
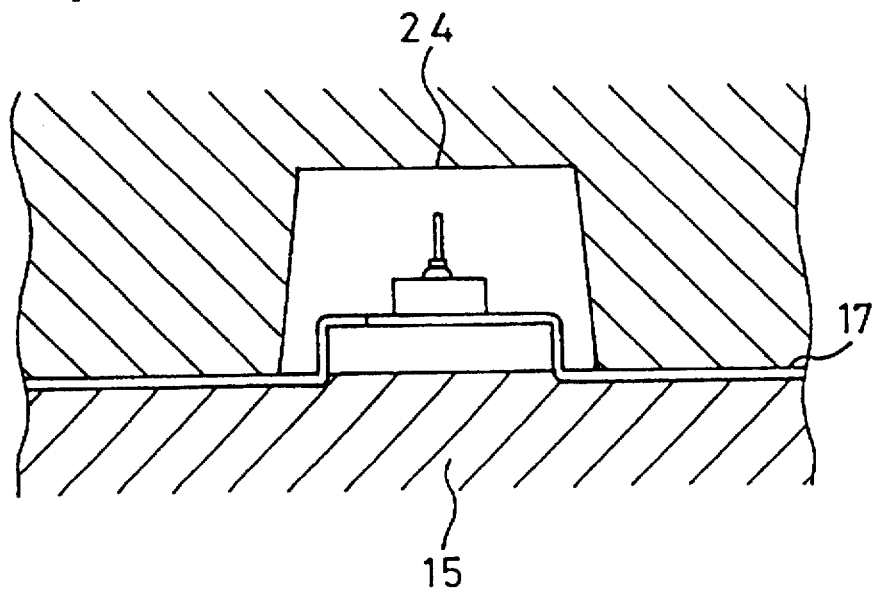
Figure 11:
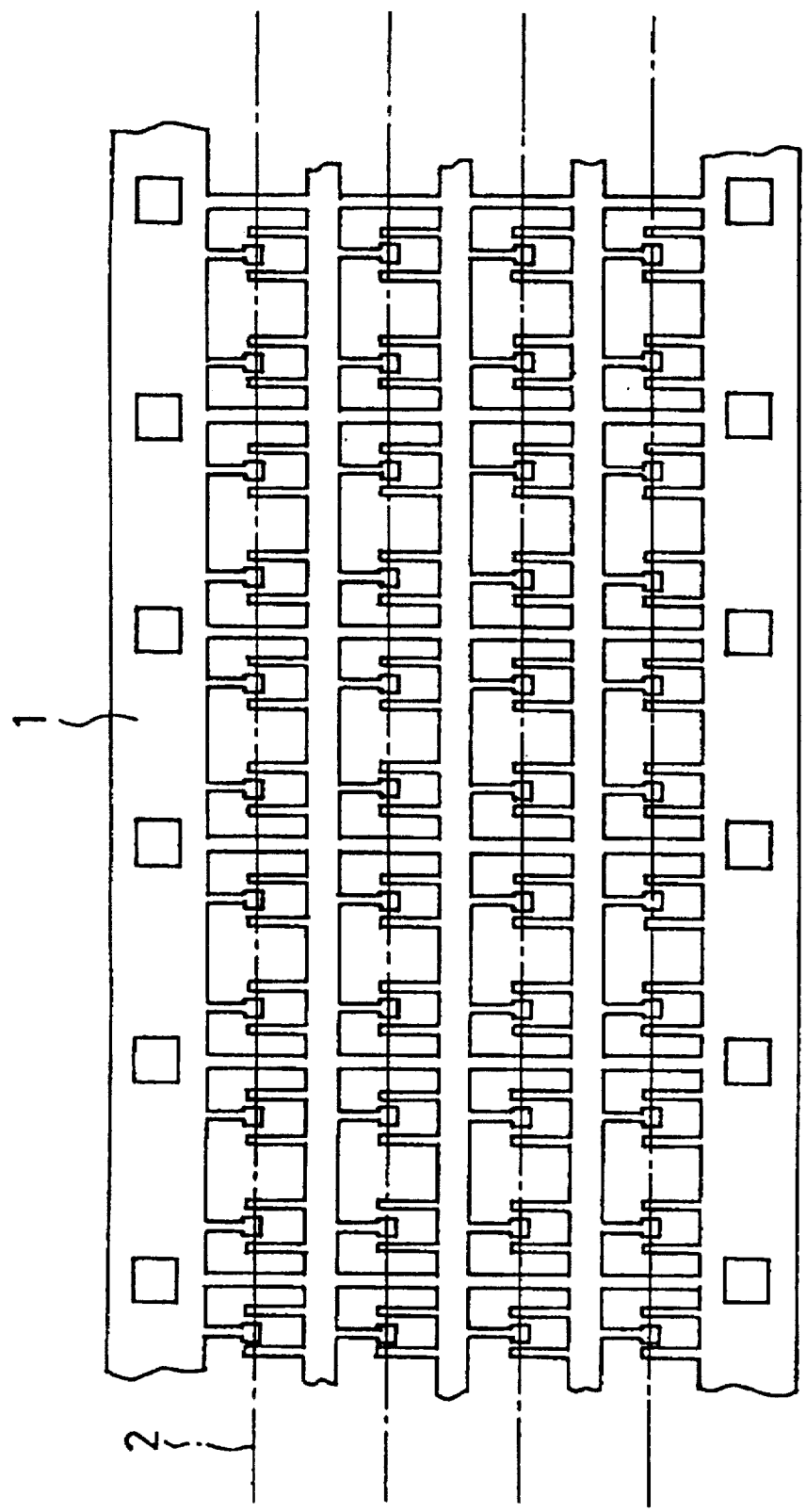
FIG. 11 is a plan view of a conventional flat hoop frame.
Figure 12:
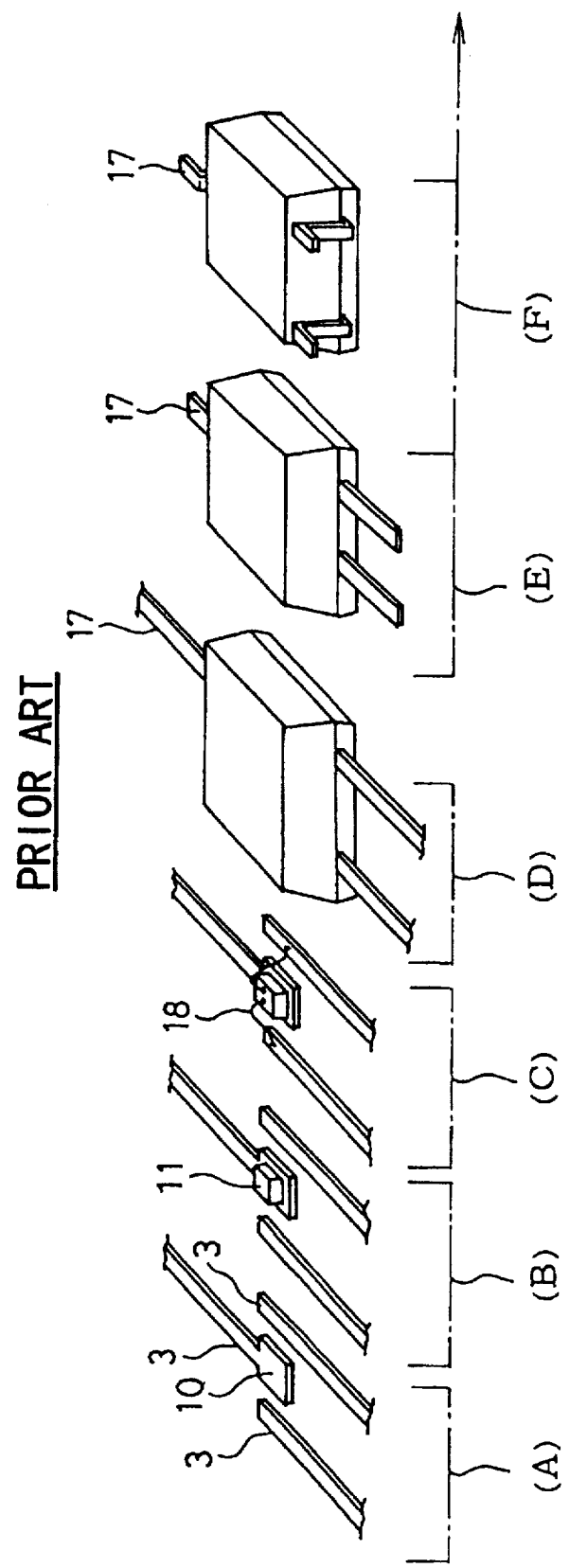
FIG. 12 is a schematic view illustrating different steps of a conventional production method for a semiconductor device.
Figure 13:
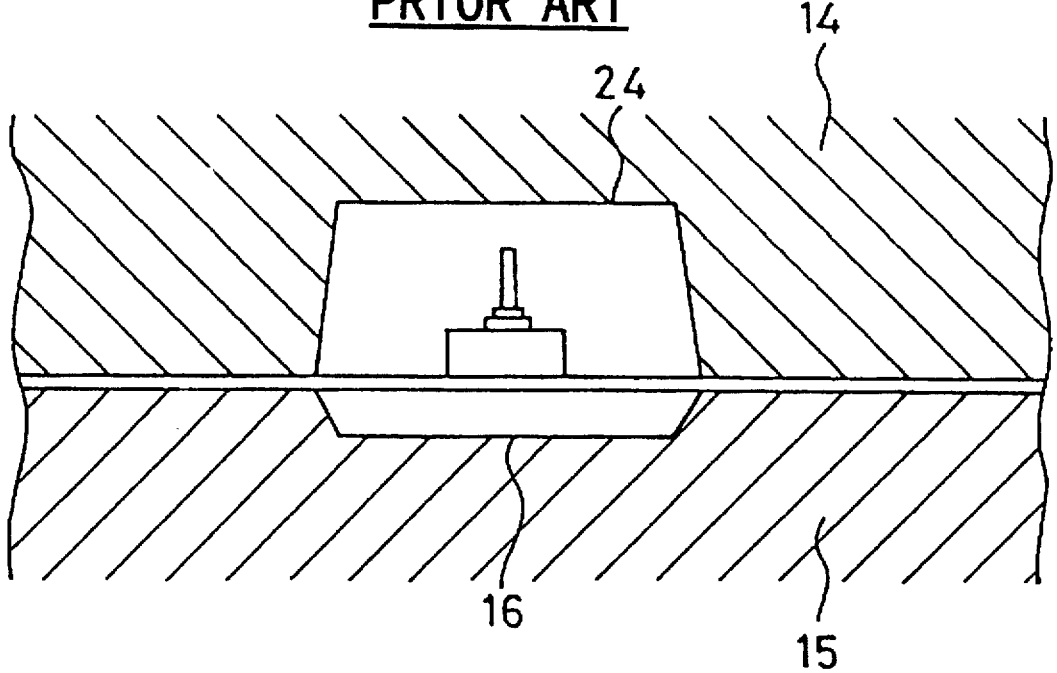
FIG. 13 is a detailed view of a resin filling metallic mold used in the production method illustrated in FIG. 12.
Figure 14:
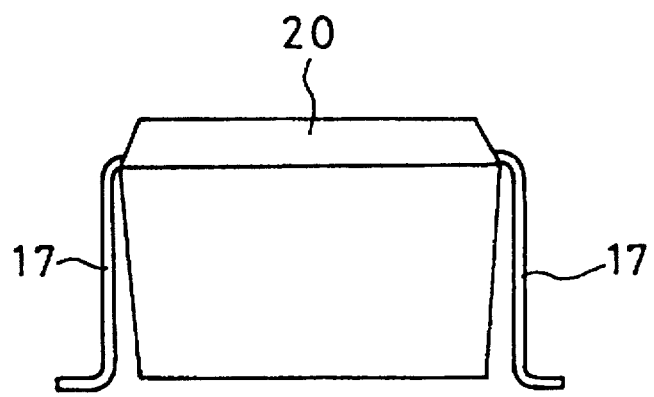
FIG. 14 is a side elevational view of an insulated semiconductor device produced by the production method illustrated in FIG. 12.

In the present embodiment, in the resin filling step following the die bonding and wire bonding steps, resin is filled only into an upper metallic mold cavity 24 of a resin filling metallic mold as seen in FIG. 10(B). Consequently, the lead shaping amount and length can be minimized.

Further, the production method of the present embodiment is advantageous in that, by boding wires 18 obliquely in the wire bonding step, lead shaping (refer to FIG. 9(D) can be performed for the conventional flat hoop frame 1 (refer to FIG. 9(C)).

Having now fully described the invention, it will be apparent to one of ordinary skill in the art that many changes and modifications can be made thereto without departing from the spirit and scope of the invention as set forth herein.

What is claimed is:

1. A production method for an insulated semiconductor device, comprising the steps of:

forming a flat hoop frame having a plurality of rows of sets of leads such that inner lead portions of the leads extend farther than corresponding resin filling centers so that outer lead portions of the leads may be positioned at predetermined positions with respect to outer profiles of semiconductor devices after resin is filled and supplying the flat hoop frame from a frame supply apparatus;

shaping the inner lead portions of the leads of the flat hoop frame simultaneously for the plurality of rows and for a plurality of pitches by a lead shaping apparatus;

performing die bonding of semiconductor pellets and wire bonding for the flat hoop frame; and filling, for each set of leads, resin into one of two cavities by a resin filling apparatus so that the outer lead portions of the leads of the flat hoop frame may be positioned at the predetermined positions with respect to the outer profiles of the semiconductor devices after the resin is filled.

2. A production method for an insulated semiconductor device as claimed in claim 1, wherein the inner lead portions of the leads of the flat hoop frame are elongated farther than the positions of the resin filling centers in accordance with the lead shaping amount determined taking a semiconductor pellet thickness and a bonding wire height into consideration.

3. A production method for an insulated semiconductor device as claimed in claim 1, wherein shaping of the inner lead portions of the leads of the flat hoop frame supplied from said frame supply apparatus is performed prior to the step of die bonding semiconductor pellets, and in the resin filling step following the die bonding step and the wire bonding step, the resin is filled into one of an upper metallic mold cavity and a lower metallic mold cavity for each set of leads.

4. A production method for an insulated semiconductor device as claimed in claim 3, wherein the inner lead portions of the leads of the flat hoop frame extend by a predetermined additional length farther than the positions of the individual resin filling centers.

5. A production method for an insulated semiconductor device as claimed in claim 3, wherein the inner lead portions of the leads of the flat hoop frame are worked into an L-shape at predetermined positions in the individual longitudinal directions in such a manner as to be positioned on the upper side or the lower side with respect to the outer lead portions of the leads.

6. A production method for an insulated semiconductor device as claimed in claim 3, wherein, in each of the semiconductor devices filled with the resin, the outer lead portions of the leads extend along an end face of the semiconductor device and outwardly from the end face.

* * * * *